United States Patent [19]
Dent

[11] Patent Number: 5,568,518
[45] Date of Patent: Oct. 22, 1996

[54] FAST AUTOMATIC GAIN CONTROL

[75] Inventor: Paul W. Dent, Stehags, Sweden

[73] Assignee: Ericsson GE Mobile Communications Inc., Research Triangle Park, N.C.

[21] Appl. No.: 305,651

[22] Filed: Sep. 14, 1994

[51] Int. Cl.$^6$ .................................................... H04L 27/06
[52] U.S. Cl. ................................. 375/340; 375/345
[58] Field of Search ........................ 375/340, 341, 375/345, 262; 371/43

[56] References Cited

U.S. PATENT DOCUMENTS

| | | | |
|---|---|---|---|
| 5,048,059 | 9/1991 | Dent | 375/340 |
| 5,093,848 | 3/1992 | Raith | 375/344 |
| 5,136,616 | 8/1992 | Dent | 375/341 |
| 5,331,666 | 7/1994 | Dent | 375/341 |
| 5,335,250 | 8/1994 | Dent et al. | 375/340 |

FOREIGN PATENT DOCUMENTS

| | | |
|---|---|---|
| 430034 | 6/1991 | European Pat. Off. |
| 594551 | 4/1994 | European Pat. Off. |

OTHER PUBLICATIONS

S. Sampei, "Development of Japanese Adaptive Equalizing Technology Toward High Bit Rate Data Transmission in Land Mobile Communications," *The Transactions of the Institute of Electronics, Information and Comm. Engineers*, vol. E74, No. 6, pp. 1512–1521, Jun. 1991.

K. Okanoue et al., "New MLSE Receiver Free from Sample Timing and Input Level Controls," *Personal Communication—Freedom Through Wireless Technology, IEEE*, Conf. 43, pp. 408–411, May 1993.

Primary Examiner—Young T. Tse
Attorney, Agent, or Firm—Burns, Doane, Swecker & Mathis, L.L.P.

[57] ABSTRACT

A method for demodulating or decoding a digitally modulated data signal is disclosed wherein AGC parameters are retain and update or discard in parallel with deciding the data patterns most likely to have been transmitted. First, the received signals are converted from analog to digital to obtain numerical signal samples. The numerical signal samples are then compared with sample values expected for each of a number of possible symbol sequences using a scaling factor associated with each of the symbol sequences in order to determine a mismatch value for each sequence. The mismatch values are then logically self-consistent. Then, the lowest cumulative mismatch value is chosen from among all the foregoing sequences that can logically precede a new sequence to be accumulated with the mismatch value from the new sequence, wherein the selected mismatch identifies a best predecessor sequence. The scaling factor associated with the best predecessor is then chosen and the scaling factor is updated to obtain the scaling factor to be associated with the new sequence.

20 Claims, 5 Drawing Sheets

FAST AUTOMATIC GAIN CONTROL

FIELD OF THE INVENTION

The present invention relates to radio receivers intended for receiving digitally modulated signals, and more particularly to a method for demodulating or decoding a digitally modulated data signal.

BACKGROUND OF THE INVENTION

Digital modulation methods include pure phase modulation methods in which the signal phase angle carries the digital information and the signal amplitude is not significant, amplitude modulation methods in which the information is carried by varying amplitude levels, and hybrid methods. Even using pure phase modulation methods, when a signal passes through a channel suffering from impairments such as echoes or time dispersion, the received signal will have amplitude variations that depend on the underlying information bits. Special detection methods which have good performance characteristics in these circumstances make use of the information in the signal amplitude variations. Whenever information is carried by amplitude variations, some scaling is necessary at the receiver to remove the arbitrary amplitude change between transmitter and receiver over the arbitrary propagation path. This scaling is effected by automatic gain control (AGC) in the receiver. A dilemma arises in deciding whether an AGC system should adapt rapidly or slowly to perceived changes in the received signal; if too fast, the information-carrying amplitude variations may be partly removed; if too slow, the receiver will fail to adapt to changing propagation path variations, due, for example, to a mobile receiver changing position.

The archetypal AGC system which has been used for approximately 60 years in analog, AM receivers are based on the information modulation usually swinging the amplitude of the transmitted signal equally above and below a mean value. By detecting the mean value of the received signal with the aid of a moving average calculation, i.e., a low-pass filter, it can be decided if the mean received signal level at the detector is in the desired range, and if not, the gain of some amplifying stage or stages in the receiver is increased or decreased to bring the detected mean within the desired range.

In addition, prior art systems exist concerning the selection of optimum time constants, thresholds, dead bands or distribution of gain control between different amplifying stages. Lately, the emergence of devices for numerical signal processing have given more flexibility to the designer to implement optimum AGC strategies within a microprocessor program.

With the development of radar, it was apparent that known AGC methods were unworkable, since it was impossible to predict the strength of an echo return from a target in advance in order to decide the appropriate receiver gain. Instead, a type of receiver and detector known as a logarithmic amplifier was devised. This type of receiver consists of a chain of progressively saturating (limiting) amplifier and detector stages, wherein the detector outputs are summed. Weak signals are only able to operate the detector at the end of the amplifying chain. As the signal level increases, this last amplifier and detector saturates, while the preceding stage begins to contribute to the output, and so forth. Thus, the device gives a unit increment in the summed detector output signal every time the input signal increases by a factor equal to the amplification per stage, hence the logarithmic characteristic. Such a receiver thus circumvents the need to employ AGC in order to function over a wide dynamic range of signal inputs.

Another distinct AGC principle used in frequency-hopping receivers is known as memory AGC. When a receiver cycles systematically or pseudorandomly among a number of frequency channels under control of a frequency-hop processor, different propagation losses on different frequencies can require that the gain be controlled according to the frequency selected. This may be done by use of digitally gain-programmed amplifier stages, wherein the gain setting for each selected frequency is recalled from a memory. After receiving a "hop" or burst of a signal on a selected frequency, the gain setting is updated and written back to the memory against that frequency so that the updated value will be used next time. Strategies for partially updating the gains that will be used on other frequencies from observations made on one frequency can sometimes be devised to ensure that the gain can adapt sufficiently fast even when each channel out of a large number of channels is infrequently selected.

A further distinct AGC principle related to radar logarithmic amplifier techniques is described in U.S. Pat. No. 5,048,059 entitled "Logpolar Signal Processing", which is incorporated herein by reference. A radio signal, having both a phase angle and an amplitude, requires a pair of number sequences to fully describe it. Conventionally, the Cartesian vector representation had been used, where the radio signal is described by an X (cosine or In phase component) and a Y (sine or Quadrature component). The radio signal would be resolved into its I and Q components by multiplying it with a cosine reference signal and a sine reference signal, smoothing the results and then digitizing them for subsequent numerical processing. In the conventional approach, AGC was required to hold the signal level at the point of digitizing within the optimum part of the dynamic range of the Analog to Digital convertor.

In the method described in the aforementioned patent, Cartesian representation was not used, but rather a polar representation in which the logarithm of the signal amplitude was determined by digitizing the detector output of a radar-type logarithmic receiver, simultaneously with digitizing the saturated output of the final amplifier stage to obtain a phase related value. In this way it was possibly to digitize a radio signal preserving its full, vector nature before determining an AGC scaling. The scaling to use for best demodulating a signal containing information in its amplitude variations can then be determined by post-processing in a numerical signal processor.

An issue closely related to AGC in receivers is automatic frequency control (AFC). The purpose of AFC is to remove frequency errors associated with transmitter or receiver frequency inaccuracies or Doppler shift due to relative movement which otherwise would hinder the extraction of information carded by frequency or phase modulation. A similar dilemma exists in the design of AFC systems as in the design of AGC systems, namely how to separate variations caused by the unknown underlying information that has to be determined from the other sources of variation. U.S. Pat. No. 5,136,616 describes a method whereby several postulates of an AFC control value are held in conjunction with corresponding postulates of the data modulation sequence underlying the received signal, the AFC values being retained and updated or discarded along with deciding which of the associated data sequences are most likely to be correct.

SUMMARY OF THE DISCLOSURE

It is an object of one embodiment of the present invention to overcome the problems in the prior art by holding multiple values of an AGC parameter corresponding to different postulated transmitted data patterns, and making decisions about which AGC parameters to retain and update or discard in parallel with deciding the data patterns most likely to have been transmitted.

According to one embodiment of the present invention, a method for decoding or demodulating received digital data modulated signals is disclosed. First, the received signals are converted from analog to digital to obtain numerical signal samples. The numerical signal samples are then compared with sample values expected for each of a number of possible symbol sequences using a scaling factor associated with each of the symbol sequences in order to determine a mismatch value for each sequence. The mismatch values are then logically self-consistent. Then, the lowest cumulative mismatch value is chosen from among all the foregoing sequences that can logically precede a new sequence to be accumulated with the mismatch value from the new sequence, wherein the selected mismatch identifies a best predecessor sequence. The scaling factor associated with the best predecessor is then chosen and the scaling factor is updated to obtain the scaling factor to be associated with the new sequence.

BRIEF DESCRIPTION OF THE DRAWINGS

These and other features and advantages of the present invention will be readily apparent to one of ordinary skill in the art from the following written description, used in conjunction with the drawings, in which.

DETAILED DESCRIPTION OF THE DISCLOSURE

The present invention is primarily intended for use in cellular communication systems, although it will be understood by those skilled in the art that the present invention can be used in other various communication applications.

The present invention relates to receivers for receiving digitally modulated signals in which data symbols are carried by corresponding transmitted signal waveforms, and in which, owing to either deliberate filtering at the transmitter for the purposes of limiting the transmitted spectrum, deliberate filtering in the receiver for the purposes of eliminating interfering signals, or accidental corruption in the transmission path by echoes from reflecting objects, the received waveform can suffer from intersymbol interference (ISI) such that received samples depend not just on a single transmitted data symbol but on several neighboring symbols. In other words, the transmission channel results in symbols being smeared into each other. This can cause purely phase modulated signals to be received with data-dependent amplitude modulation as well as phase modulation, and similarly, purely amplitude modulated signals can be received with phase modulation added. The data modulation can be performed using a variety of methods, such as phase shift keying, quadrature, phase shift keying, offset quadrature phase shift keying, minimum shift frequency modulation, Gaussian-filtered minimum shift frequency modulation, multilevel amplitude, phase or frequency modulation, multilevel quadrature amplitude modulation, impulse-excited quadrature amplitude modulation, and Pi/4-rotated quadrature phase shift keying.

A known method of demodulating signals suffering from these effects employs a model of the total transmission path between the modulating data source and the demodulator. The model is used to predict both the phase and amplitude, i.e., the complex vector value, of the received signal samples for all possible data symbol sequences. The predictions are then compared with the actual received signal samples and a decision is made as to which postulated data symbol sequence gives the best match.

The number of possible data sequences that need be considered is finite. If a given symbol suffers from ISI only from the immediately surrounding symbols then it suffices to consider only all possible symbol-triples in predicting a received signal sample. Using binary symbols, there would thus be only 8 possible combinations to consider. Using quaternary modulation, there would be 64 possible combinations to consider.

A decision for a symbol-triple has to be consistent with the symbol-triples it overlaps with. For example, the binary triple 110 can only logically be decided to be the best if the previous triple was decided to be 011 or 111 and the next is decided to be 100 or 101, because the three triples overlap as shown below:

| previous | 011 | or | 111 |    | 111 | or | 011 |
|----------|-----|----|----|----|-----|----|-----|
| current  | 110 |    | 110 |    | 110 |    | 110 |
| next     | 101 |    | 101 | or | 100 |    | 100 |

Of the 8×8×8=512 possible decisions that could be taken for three consecutive triples independently, only 2×8×2=32 are logically consistent.

A sequential maximum likelihood sequence estimation algorithm, commonly known as a Viterbi algorithm, may be employed to determine the best, logically consistent sequence of symbols with the above constraints. It may be seen from the above that, in the binary case, there are only two allowed predecessor triples for each possible new triple. The Viterbi algorithm works by keeping scores, called path metrics, for each of the eight possible symbol triples, representing the accumulated mismatch to date between signal samples predicted and signal samples received. When a new prediction is compared with a new signal sample, the new mismatch is accumulated only with the lower of the path metrics of its two possible predecessors, the result becoming the new path metric for one of a new set of eight symbol sequences. The lower of such path metric pairs can in fact be precomputed so that only 4 values have to be stored for the case where signal samples depend on 3 bits. In general, a Viterbi algorithm maintains $M^{N-1}$ candidate symbol sequences, called "states", where M is the number of different symbol values in the alphabet and N is the number of symbols on which each signal sample depends.

Figure 1:
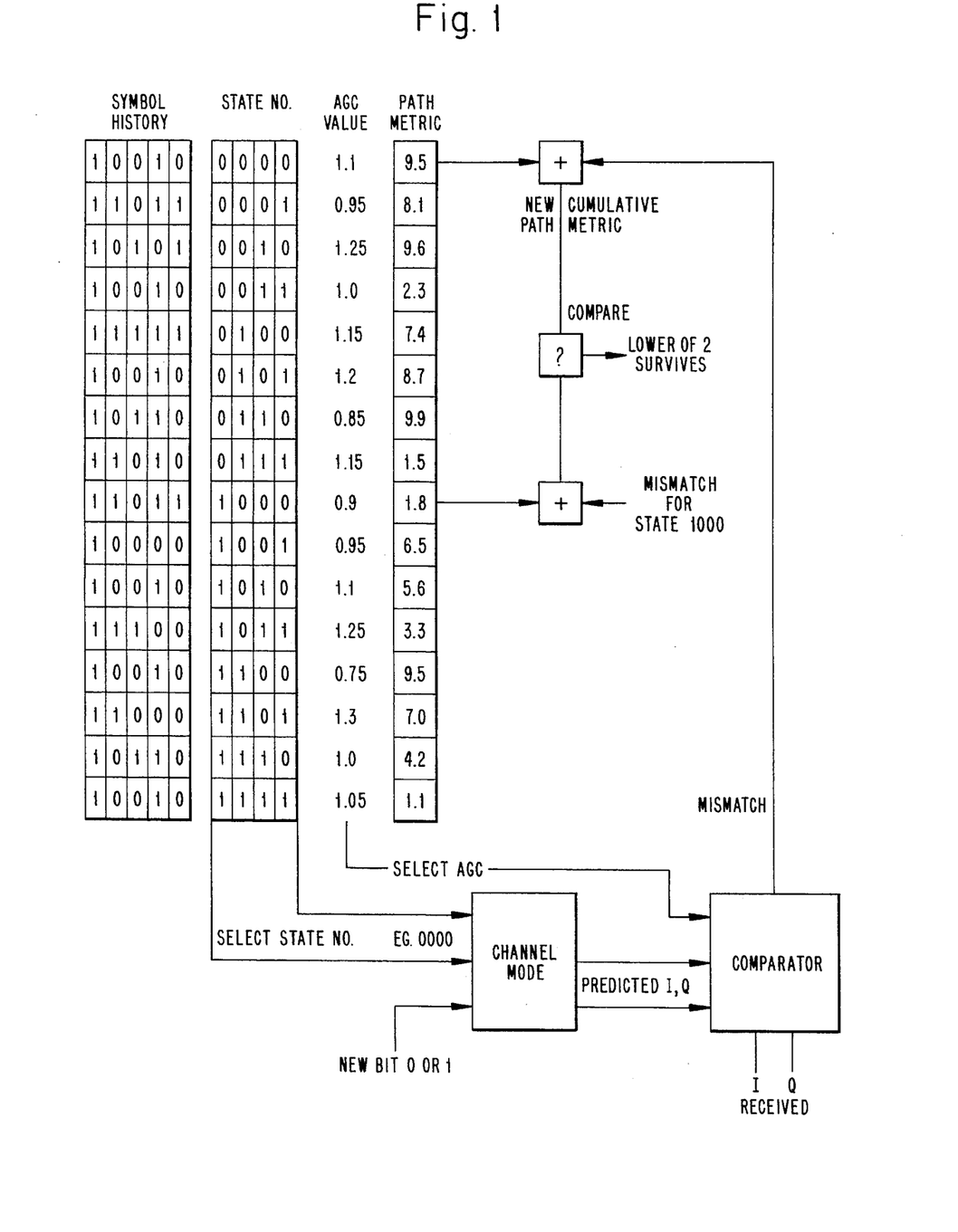
FIG. 1 illustrates a 16-state MLSE demodulator for binary symbols according to the present invention.

A diagrammatic representation of a 16-state MLSE demodulator for binary symbols according to the invention is shown in FIG. 1. A number of electronic storage elements are arranged in groups called states, the number of states being $2^{(n-1)}$ where n is the number of consecutive data symbols on which each signal sample depends. This is also termed the impulse response length of the channel. The storage for each state holds three different types of information, the so-called bit-history associated with each state, the path metric associated with each state, and an AGC or scaling parameter associated with each state. It is not necessary to store the (n−1)-bit state number explicitly, because it is implicit in the position of the data within the storage memory.

An important part of the MLSE decoder is a model of the channel and appropriate parts of the transmitter modulation process, which are used to predict what signal sample values should be received for a given symbol sequence transmitted. Often the modulation process is linear, and it and the channel can be represented by the linear combination:

$$R(i)=Co\cdot S(i)+C1\cdot S(i-1)+C2\cdot S(i-2)\ldots +C(n-2)\cdot S(i-n+2)$$

where $Co, C1, C2 \ldots C(n-2)$ are n−2 complex coefficients and $S(i), S(i-1)$, etc., are n−2 successively transmitted bits of value +1 or −1. $R(i)$ is the predicted, complex received sample value for that combination of bits. The coefficients $Co \ldots C(n-2)$ are generally established by sending a training pattern of data symbols known a-priori to the receiver. This sync code or training pattern establishes the complex coefficients needed by the channel model either at the beginning of a transmission or at regular intervals during the transmission. However, it is possible that the signal level will drift between these intervals such that the predictions will begin to differ in amplitude from the received samples.

In the 16-state example of FIG. 1, the channel model predicts received I,Q values to be dependent on 5 consecutive symbols, the four implicit in the state number and one new symbol, which can be a 1 or a 0, which is not yet determined. The predicted values are compared with the received values and the sum-square difference is computed as $$(Ip-Ir)^2+(Qp-Qr)^2$$

where suffix p represents the predicted value and r represents the received value. This sumsquare mismatch is added to the cumulative mismatch stored against that state and compared with a value computed similarly from the state number differing in the most significant bit position only. This is the bit that is about to move leftwards one place and out of the five-bit window that affects the I,Q values. When state numbers 0abc and 1abc left-shift in a new bit 'd' they both generate new state number abcd and it has to be decided which of the two original states' cumulative path metrics plus a new sumsquare mismatch shall become the cumulative path metric for the new state number abcd. The decision is made as a result of the comparison mentioned above and the predecessor state chosen is that which gives the lower path metric. In addition to the new path metric being derived from a selected predecessor state, the bit-history to the left of the state number (i.e., older bits than those of the state number) are also copied from the selected predecessor state to the new state. This ensures that the bit sequence stored against The state is consistent with the path metric stored against the state, i.e., that the path metric was truly a result of the associated bit sequence.

By choosing abc in the two compared states 0abc and 1abc together with the new bit d of either 0 or 1, new values for all 16 states are computed by this means and that completes one iteration of the algorithm to demodulate one signal sample. The process described above will now be described in a step-by-step manner.

For the first state, numbered 0000, it is postulated that the new bit is also a 0. The term 00000 is thus applied to the channel model to obtain the I,Q values that would be expected to be received given that 00000 was transmitted. The actual I,Q values received are compared with the values calculated above and the sumsquare mismatch is computed. The sumsquare mismatch is added to the path metric for state 0000, to get one of the two candidate values for the path metric for the new 0000 state.

The above-described operation is repeated now using state 1000, with the postulate of a new 0 to obtain the second candidate value for the new path metric. The two candidate path metrics are then compared and the lower path metric is selected. The bit history from the selected predecessor state, i.e., 0000 or 1000 then becomes the bit history for the new 0000 state. In addition, the symbol history is left shifted one place and the most significant bit of the predecessor state is shifted into the first position.

The whole process is repeated with the postulate that the new bit is a 1. This results in a new state 0001 which also had the possible predecessors 0000 and 1000.

The whole process is repeated for every pair of predecessors such as 0001 and 1001 (resulting in new states 0010 and 0010), 0010 and 1010 (resulting in new states 0100 and 0101), 0010 and 1011 (resulting in new states 0110 and 0111), etc.

At the end of one such above iteration, a received I,Q sample has been processed and one extra bit has been demodulated. Because of the way bit histories overwrite other bit histories when one of a pair of states is selected to survive, the older bits in the bit history memories tend to converge on one bit. If the oldest bit in all bit histories agree, there is clearly no further ambiguity and it may be extracted as the final decision, shortening the bit histories by one bit. If this does not occur before the available bit-history storage is full, the usual procedure is to select as a final decision the oldest bit from the state having the lowest cumulative metric, discarding the oldest bits from the other states. However, other alternatives exist such as storing in the history memories pointers forming a linked list from which the history of any state can be traced back.

The above algorithm operates only so long as the coefficients used in the channel model to predict received I,Q values are still valid. U.S. Pat. Nos. 5,136,616 and 5,093,848 propose correcting the predicted or received values for drift of the signal phase during demodulation, which uncorrected would lead to divergence of predicted values from received values with consequent disfunction. In the patents, a phase correction value was proposed to be stored in every state. These were used to angularly rotate the predicted or received I,Q values relative to each other to correct for phase drift. In addition, the phase correction values were proposed to be updated each time a sample was processed, in a direction and by an amount that make the predictions agree better with received samples. A separate phase correction value is needed for each state because only one state holds the true postulate of the received data sequence, the other being in error, but as yet sufficient information to tell which is the true postulate had not been processed. A phase value can thus only be updated on the assumption that the bit sequence postulate in its associated state number is true. When one of a pair of states is selected as the preferred predecessor of a new state, the associated phase correction value is also selected to be the phase correction value for the new state, and is updated. In this way, the phase correction value associated with the state that holds the true sequence will have been computed and updated using the true bit sequence. For all states, the associated phase correction value will have been produced by updates using the bit values in the associated history on the assumption that they are correct. Each phase correction value is by this means kept consistent with other elements stored against its associated state in that they are all based on the same assumption that the associated bit sequence is true.

In the present invention, a similar technique is used to correct the received signal for amplitude drift. An "AGC factor" or scaling factor is stored against each state as shown in FIG. 1. The AGC factor is used to scale the received signal or predicted values during comparison so that the mismatch is reduced. The AGC factors are updated during this process in a direction and by an amount that will reduce the mismatch still further. This process will now be described below.

When a scaling factor "a" is applied to the received values Ir, Qr, the square mismatch is:

$$(Ip - a \cdot Ir)^2 + (Qp - a \cdot Qr)^2 \qquad (1)$$

By differentiating with respect to "a" and equating to zero, the optimum value of "a" is:

$$a = \frac{IrIp + QrQp}{IrIr + QrQr} \qquad (2)$$

If the signal and predictions are expressed in polar form (Rr,Ar) (Rp,Ap) the expression for "a" becomes:

$$a = \frac{Rr}{Rp} \cos(Ar - Ap) \text{ or } \text{LOG}(a) =$$

$$\text{LOG}(Rr) - \text{LOG}(Rp) + \text{LOGCOS}(Ar - Ap)$$

which well suits the use of logpolar signal processing.

When the scaling factor "a" is applied to the predicted values, the square mismatch is:

$$(Ir - a \cdot Ip)^2 + (Qr - a \cdot Qp)^2 \qquad (3)$$

By differentiating with respect to "a" and equating to zero, the optimum value of "a" becomes:

$$a = \frac{IrIp + QrQp}{IpIp + QpQp} \qquad (4)$$

If the signal and predictions are expressed in polar form (Rr,Ar) (Rp,Ap) the expression for "a" becomes:

$$a = \frac{Rp}{Rr} \cos(Ar - Ap) \text{ or } \text{LOG}(a) =$$

$$\text{LOG}(Rp) - \text{LOG}(Rr) + \text{LOGCOS}(Ar - Ap)$$

which well suits the use of logpolar signal processing.

There are advantages and disadvantages for both these methods however. The disadvantage of the first method is that the denominator IrIr +QrQr can become zero because Ir and Qr are subject to receiver noise. It can also be considered a disadvantage that when the signal fades, the signals' Ir,Qr values are increased by the scaling factor, so that the noisier signal contributes just as much emphasis to the metrics as before. On the other hand, the second method reduces the metric contribution from faded sections of the signal, but possibly by too much so that the faded signal is not properly decoded even if its signal-to-noise ratio is still good.

Therefore, a metric in which both signal and prediction values are scaled in opposite directions is proposed:

$$(a \cdot Ir - Ip/a)^2 + (a \cdot Qr - Qp/a)^2 \qquad (5)$$

When this is differentiated with respect to "a" and equated to zero, the optimum value of "a" becomes:

$$a^4 = (Ir^2 + Qr^2) / (Ip^2 + Qp^2) = Rr^2/Rp^2$$

or $$\text{LOG}(a) = [\text{LOG}(Rs) - \text{LOG}(Rp)]/2 \qquad (6)$$

If the mismatch expression (5) is expressed in polar coordinates the equation becomes:

$$a^2 Rr^2 + Rp^2/a^2 - 2 \cdot Rp \cdot Rr \cdot \text{COS}(Ar - Ap) \qquad (7)$$

The first term is the same for all state numbers and therefore does not affect the selection of the optimum predecessor states, so the term can be omitted from the metric calculations. It can be desirable, however, to accumulate this term in a separate bin for the purposes of constructing the true, final metric value at the end of a series of processing cycles.

The second term can be calculated, given LOG(a) and the predictions in logpolar form as $$\text{ANTILOG}\{2[\text{LOG}(Rp) - \text{LOG}(a)]\} \qquad (8)$$

The ANTILOG function can be implemented in a practical machine by means of a look-up table in read-only memory.

The final term can be calculated as $$\text{ANTILOG}\{\text{LOG}(Rp) + \text{LOG}(Rr) + \text{LOG2COS}(Ar - Ap)\} \qquad (9)$$

The function LOG2COS can also be implemented as a look-up table of precomputed values of the logarithm of twice the cosine of the angle.

The "a" value given by expression (6) is an instantaneous value, but instantaneous values are not the best values to use in computing expression (7). If instantaneous values are substituted from expression (6) into expression (7) it will be found that "a" cancels out, so no AGC factor is needed. While this is an alternative to scaling in general, i.e., to define an amplitude-invariant metric, the performance is not as good as when a smoothed value of "a" is used instead of instantaneous values in computing expression (7).

By denoting the current smoothed value of "a" in state number "k" as a(k,n), and the updated value as a(k,n+1), a suitable updating equation becomes:

$$a(k,n+1) = a(k,n) + (a - a(k,n))/2^m$$

where "a" is the value calculated by means of equation (6) and $2^m$ is chosen to simplify division to a right shift of "m" places. The value of "m" determines how fast the demodulator adapts to changes in signal amplitude. In the case where logpolar calculations are employed, it is appropriate to hold the value of LOG(a) needed by equation (8).

By denoting the current logarithm of "a" in state "k" as La(k,n) and by denoting the next value as La(k,n+1), a suitable updating equation becomes:

$$La(k,n+1) = La(k,n) + (\text{LOG}(a) - La(k,n))/2^m$$

By substituting for LOG(a) from (6) the equation becomes:

$$La(k,n+1) = La(k,n) + (\text{LOG}(Rr)/2 - \text{LOG}(Rp)/2 - La(k,n))/2^m \qquad (10)$$

This equation can be implemented in digital logic using fixed point arithmetic with only additions, subtractions and shifts.

Figure 2:
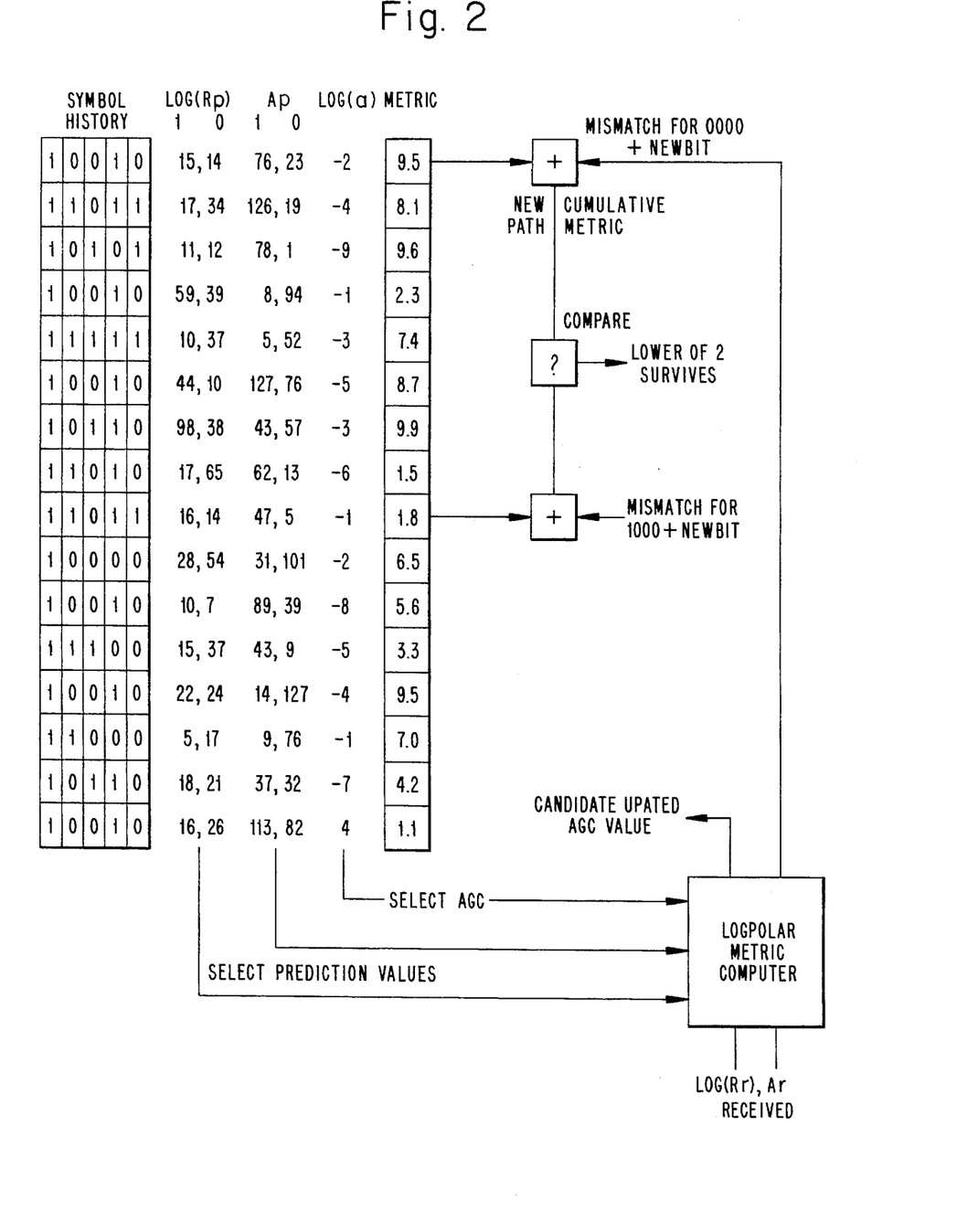
FIG. 2 illustrates an MLSE demodulator using logpolar arithmetic according to one embodiment of the present invention.

For the embodiment where logpolar signal processing is chosen, FIG. 2 shows the structure of a demodulator when the logpolar prediction values Lp=LOG(Rp) and Ap and the logarithmic AGC values La(k) are distributed to their associated states. The example values shown for the logarithm of the predicted amplitude LOG(Rp) for each state assume an 8-bit integer representation of the natural logarithm of Rp in the format xxxx.xxxx, while the phase angle values Ap assume that the range 0 to 2Pi is represented by integer values 0 to 127. The representation of the AGC values LOG(a) is the same as for LOG(Rp).

Figure 3:
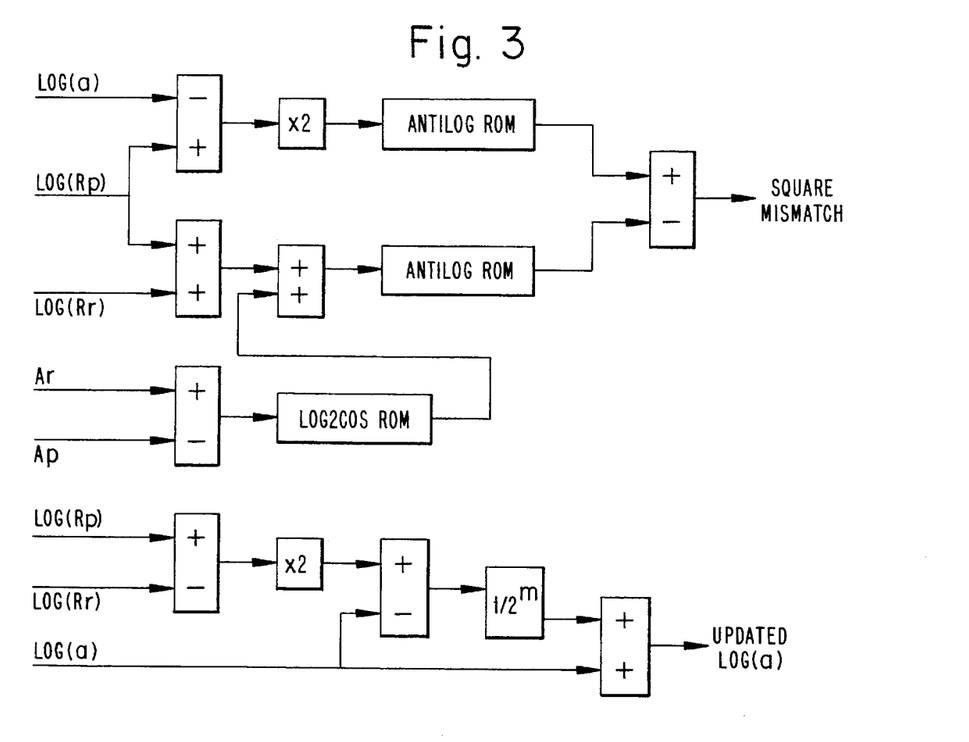
FIG. 3 illustrates a logpolar metric computer according to one embodiment of the present invention.

The operation of the demodulator with the structure of FIG. 2 will now be described with reference to FIG. 3. It is assumed that the logpolar prediction values LOG(Rp),Ap have already been established for all possible 5bit sequences by for example the transmission of a known demodulator training pattern.

For the first state (0000), it is postulated that the new bit is a 0 and a pair of prediction values LOG(Rp),Ap are selected for the case newbit=0 and applied to the logpolar metric computer along with the AGC value LOG(a) from that state and the received logpolar signal values LOG(Rr), Ar.

The metric computer calculates the sum square mismatch with the aid of equations (7), (8) and (9) and ANTILOG and LOG2COS look-up tables. The mismatch is added to the path metric for state 0000, to get one of the two candidate values for the path metric for the new 0000 state. The metric computer also produces an updated candidate AGC value using equation (10), for example.

The above operations are repeated using state 1000, with the postulate of a new 0 to obtain the second candidate value for the new path metric and a second candidate value for the updated AGC value.

The two candidate path metrics are then compared and the lower pat metric is selected. The bit history and updated AGC value from the selected predecessor state (0000 or 1000) then become the bit history and AGC value for the new 0000 state. In addition, the bit history is left shifted one place and the most significant bit of the predecessor state is shifted into the first position.

The whole process is repeated with the postulate that the new bit is a 1. This results in a new state 0001 which also had the possible predecessors 0000 and 1000.

The process is then repeated for every pair of predecessors such as 0001 and 1001 (resulting in new states 0010 and 0010), 0010 and 1010 (resulting in new states 0100 and 0101), 0010 and 1011 (resulting in new states 0110 and 0001), etc.

Other implementations of the metric computer are also possible using Cartesian (I,Q) representation with logpolar to Cartesian conversion being performed by look-up tables.

Figure 4:
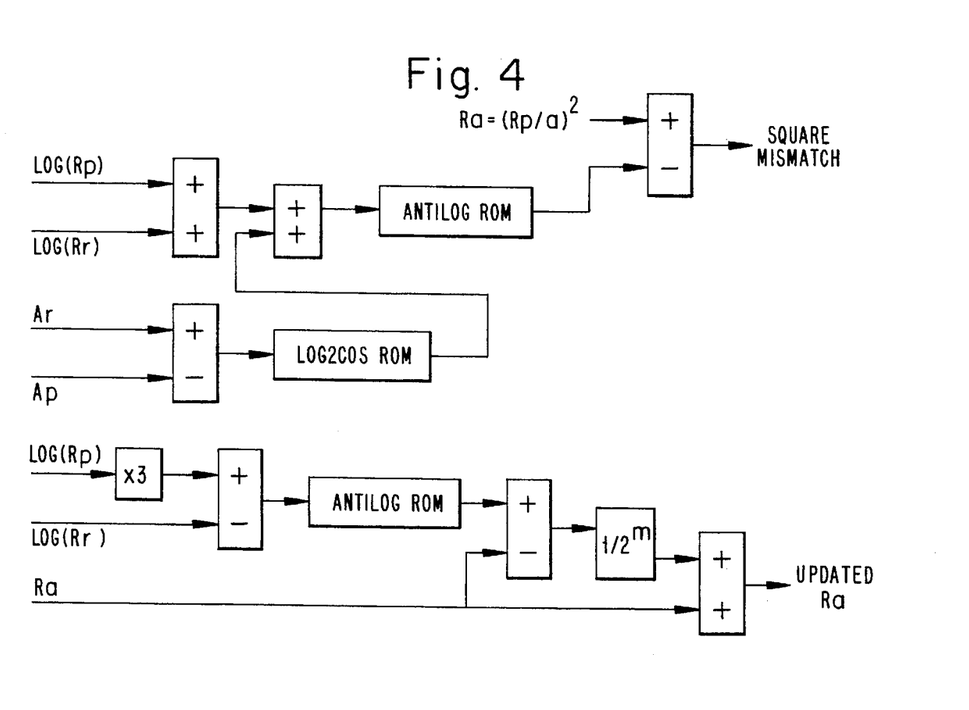
FIG. 4 illustrates another logpolar metric computer according to another embodiment of the present invention.

Other configurations of the metric computer are also possible using logpolar arithmetic. FIG. 4 shows a configuration in which the value $(Rp/a)^2$ is stored instead of LOG(a), and directly updated instead of updating LOG(a). By denoting the stored value as Ra, a suitable updating equation becomes:

$$Ra(n+1)=Ra(n)+(Rp^3/Rr-Ra(n))/2^m$$

which is implemented by calculating $Rp^3/Rr$ logarithmically.

An issue in the design of metric computers of the above type is the dynamic range of the square mismatch values and path metrics, and the consequent wordlengths necessary in the arithmetic. This problem can be avoided by either of two means. The use of logarithmic arithmetic for the metric values also, or the prescaling of the entire sample block received between demodulator training patterns to a maximum amplitude of unity. The latter method is somewhat simpler so it is a preferred implementation. The block scaling method operates as follows.

The receiver assembles a block of received complex samples, which may conveniently have been digitized by the logpolar method. This has the advantage that the sample amplitudes are available in logarithmic form, so that scaling to the largest amplitude simply requires finding the largest logamplitude and then subtracting it from the other logamplitudes in the block. The largest amplitude Rr is then equal to 1. Preferably using known data symbols contained within the assembled block, the receiver then proceeds to determine the predicted logamplitude and phase values LOG(RP) and Ap for each possible symbol sequence within the finite channel impulse response length. These values of Rp will be on the same order as Rr at least in the vicinity of the known training symbols used to compute them and in the vicinity of but less than unity. Therefore, the initial value of "a" is unity and LOG(a) is initially zero, Rp·Rp/a being also on the order of unity. The term 2Rr·Rp·cos(Ar–Ap) will be on the order of 2, so that the square mismatch will be in the vicinity of –1 for a good match and +3 for a bad match. This is due to omission of the unnecessary term $(aRt)^2$ from the metric, which would have guaranteed a positive result between zero and four. The metrics tend therefore, to grow negatively, but this can be prevented by a variety of the techniques such as: adding 1 at each iteration; subtracting the lowest (most negative) metric value from the rest at each iteration; or, subtracting a metric only when it exhibits underflow from all the metrics.

Thus, by the techniques of block scaling and one of the above techniques to limit metric growth, the dynamic range or wordlength needed for metric calculations can be contained to practical values such as 16 bits or less. Furthermore, by using adaptive scaling with a scaling factor separately adapted for each Viterbi state in the demodulator, the demodulator can be rendered insensitive to changes in received signal strength between the occasions on which it performs block scaling or recomputation of the prediction values.

Figure 5:
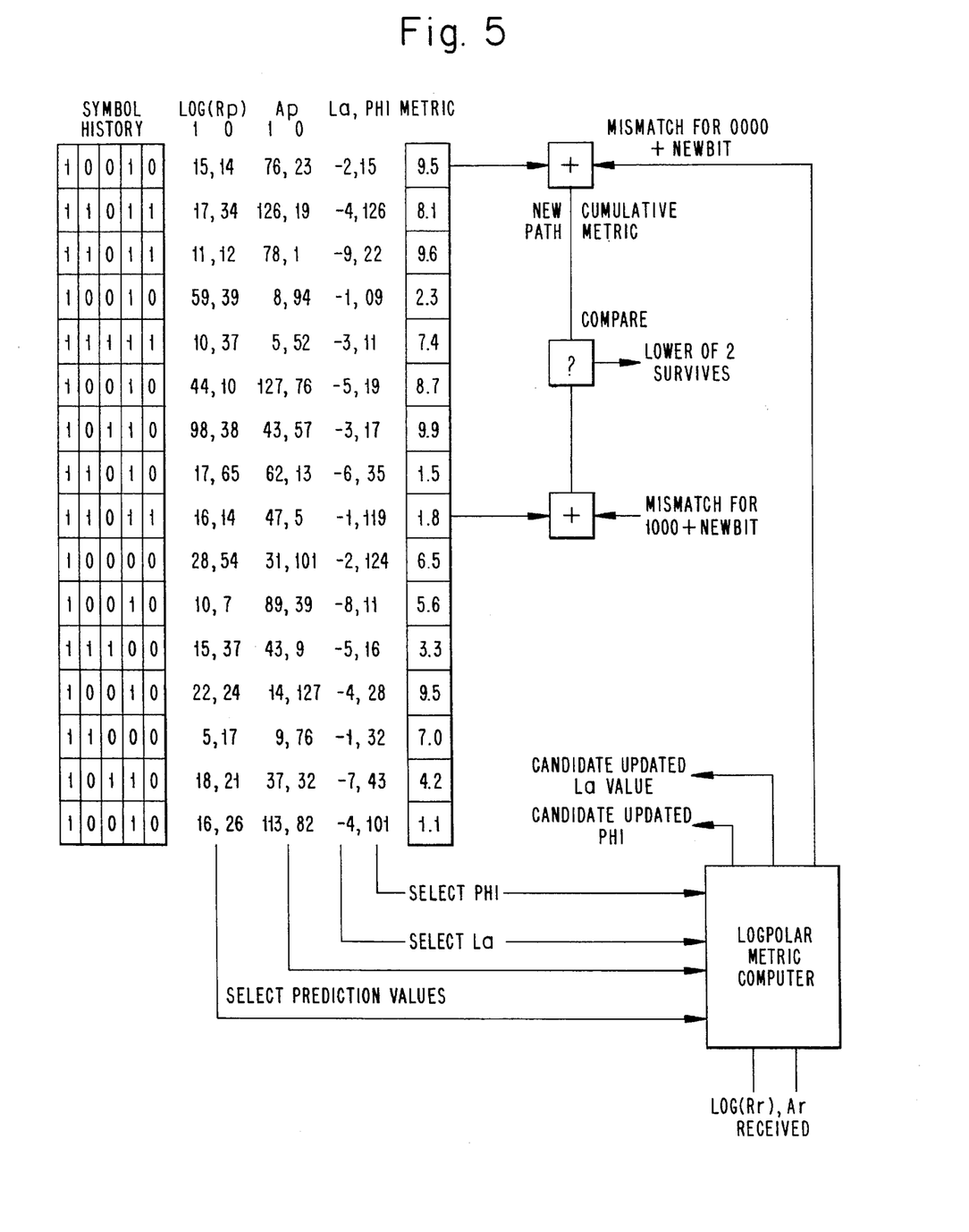
FIG. 5 illustrates an MLSE decoder having simultaneously per-state AFC and AGC according to one embodiment of the present invention.

In addition, the present invention can conveniently incorporate the automatic frequency control method disclosed in U.S. Pat. Nos. 5,136,616 and 5,093,848 to obtain a demodulator that tracks both phase and amplitude changes over the block of signal samples processed. The structure of an MLSE decoder having simultaneously per-state AFC and AGC is shown in FIG. 5.

The stored AGC values (La=LOG(a)) have now been paired with associated phase correction or AFC values (Phi). The AGC values are used in the metric computer as previously described while the Phi values are used in modulo 2Pi addition with the received phase values Ar to correct them for progressive drift prior to comparison with predicted phase values Ap. The AFC (Phi) values are updated by rotating them in the direction that would make the received Ar values agree more closely with the predicted Ap values. In the same way that two candidate updated AGC values are produced for each new state, two updated AFC values are produced and that selected to survive in the new state corresponds to the predecessor state selected to give the lowest metric. In many applications, a very simple method of updating the Phi values can suffice. If the value of Ar+Phi–Ap is positive, i.e., 1 to 63 if 7-bit phase values are used, then Phi is reduced by 1 least significant bit and if Ar+Phi–Ap is negative, i.e., 64 to 127 if 7-bit phase values are used, then Phi is increased by 1 least significant bit.

Figure 6:
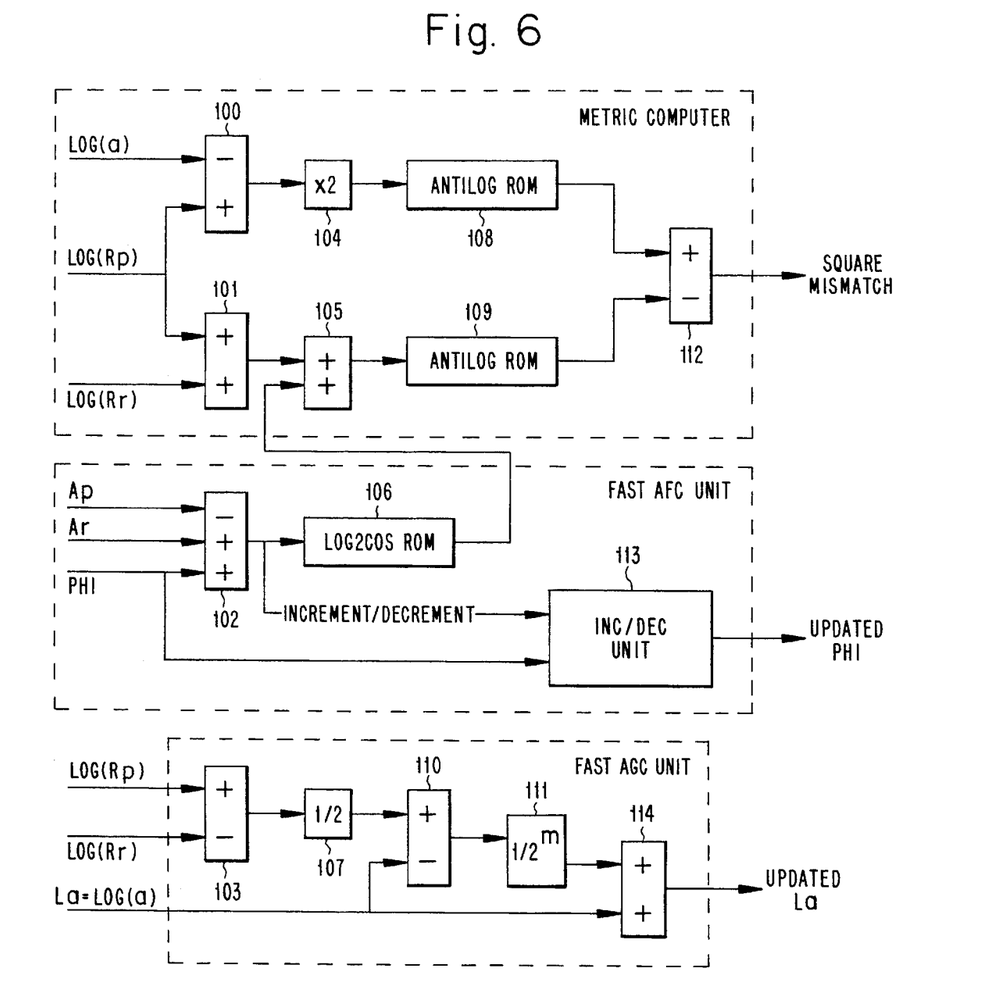
FIG. 6 illustrates a logpolar metric computer for combined AFC and AGC according to one embodiment of the present invention.

The structure of a metric computer that also embodies simultaneous AGC scaling and phase tracking AFC is illustrated in FIG. 6. Received logpolar data Log(Rr), Ar are digitized and stored in a memory corresponding to one signal segment (e.g. TDMA burst). The largest value of log(Rr) in the data block can be determined outside the computer of FIG. 6 and subtracted from all of the Log(Rr) values, thus normalizing the vector amplitude to a peak value of unity. The prediction values of FIG. 5 are then computed with the aid of a known syncword pattern embedded in the signal segment by means of a channel estimation process, e.g. correlation with the known pattern. The prediction values unmodified by scaling are initially the best possible values to use, if demodulation progresses starting with data near the syncword. Due to potential drift in amplitude and phase away from the syncword however, the scaling and phase shall be updated as demodulation progresses by means of the present invention.

The metric implemented is that described by equation 7, with the first term omitted, as it does not depend on the symbol decisions. The second term $(Rp/a)^2$ is calculated using values of Log(Rp) and Log (a) where "a" is the scaling factor. The initial value of Log(a) is set equal to zero (a=1). A subtractor 100 subtracts the Log of "a" from the Log of Rp to obtain the Log of Rp/a. A one bit left shift in a shifter 104 doubles the value to the Log of the square. An antilog ROM 108 computes the exponential of the resultant to obtain the value of the square.

In parallel, the last term of equation (7) is computed. A subtractor 102 calculates the phase difference between the phase prediction Ap and the received phase At, and also adds a phase tracking term Phi, which is initially zero. A ROM 106 contains a lookup table for the Log of twice the cosine of this angular difference. An adder 101 adds the Logs of Rp and Rr and an adder 105 adds their sum to the LOG2COS result stored in ROM 106 to obtain the logarithm of 2RpRr·Cos(Ar−Ap+Phi). An antilog ROM 109, which as will be appreciated by those of average skill in the art can be physically the same as the ROM 108 used on a time shared basis, is then used to obtain the value of the term. This term is subtracted from the value from the ROM 108 to obtain the quadratic mismatch metric used in the Viterbi process of FIG. 5. The scaling value Log(a) and the phase drift compensation PHI are then updated.

The scaling value is updated using equation (10). A subtractor 103 forms the difference between the Log of Rp and the Log of Rr giving the Log of Rp/Rr. Then a right-shifter 107 divides the difference by two to obtain the log of the square root of Rp/Rr, as suggested by equation (6). Then Log(a) is updated towards this value by computing the difference between Log(a) and the target value in a subtractor 110, fight shifting the result m-places in a fight shifter 111 to obtain a fraction ½$^m$ of the difference, then moving Log(a) towards the square root of Rp/Rr by adding the fraction to Log(a) in an adder 114. The updated value is only one of the candidate new values that have yet to be chosen to become the updated value of Log(a) for a particular Viterbi state. The Viterbi algorithm depicted in FIG. 5 chooses the best predecessor state for each new state to be that which results in the lower cumulative metric for the new state. The updated value of Log(a) computed for the selected predecessor state, i.e., the value computed using predictions Log(Rp), Ap from the selected state, is the value that is written into the La memory of the new state.

The phase tracking value Phi is also updated in a direction to close the gap between predicted phases Ap and received phases Ar. The gap is determined by the modulo-2Pi adder/subtractor 102, which comprises correcting the prediction by adding the current value of Phi. If the result is positive, i.e., an angle between 0 and +180 degrees, the Phi value is too large. On the other hand if the result is negative, the Phi value should be increased. These changes to Phi are made by an increment/decrement unit 113. The result is one candidate for the updated Phi value, and the candidate which will be chosen to become the updated Phi value for the new state is selected at the same time as the Log(a) candidate is chosen. The Phi and La values are in other words selected from the same iteration of the computer, being the iteration that produced the lowest cumulative metric for the new state. In this way, the present invention guarantees that the updating of AGC and phase tracking values takes place using the best symbol sequence that will be finally selected by the Viterbi algorithm as the demodulated output.

The above description describes a first-order phase tracking loop. Second order phase tracking loops can also be employed to provide greater tolerance of frequency error, as is disclosed in U.S. Pat. Nos. 5,136,616 and 5,093,848.

It will be appreciated by those of ordinary skill in the art that the present invention can be embodied in other specific forms without departing from the spirit for essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

We claim:

1. A method for demodulating or decoding received digital modulated signals, comprising the steps of:

obtaining numerical signal samples from said received signals;

comparing said numerical signal samples with sample values expected for each of a number of possible symbol sequences using a scaling factor associated with each of said symbol sequences in order to determine a mismatch value for each sequence;

accumulating said mismatch values for all consecutive symbol sequences that are logically self-consistent;

choosing the lowest cumulative mismatch value from among all foregoing sequences that can logically precede a new sequence to be accumulated with the mismatch value from said new sequence, wherein said chosen mismatch value identifies a best predecessor sequence; and choosing the scaling factor associated with said best predecessor sequence and updating the scaling factor to obtain the scaling factor to be associated with said new sequence.

2. A method according to claim 1, wherein modulation of the received signals is performed using Phase Shift Keying.

3. A method according to claim 1, wherein modulation of the received signals is performed using Quadrature Phase Shift Keying.

4. A method according to claim 1, wherein modulation of the received signals is performed using Offset Quadrature Phase Shift Keying.

5. A method according to claim 1, wherein modulation of the received signals is performed using Minimum Shift Frequency Modulation.

6. A method according to claim 1 wherein modulation of the received signals is performed using Gaussian-filtered Minimum Shift Frequency Modulation.

7. A method according to claim 1, wherein modulation of the received signals is performed using Multi-level amplitude, phase or frequency modulation.

8. A method according to claim 1, wherein modulation of the received signals is performed using Multi-level Quadrature Amplitude Modulation.

9. A method according to claim 1, wherein modulation of the received signals is performed using Impulse-excited, Quadrature Amplitude Modulation.

10. A method according to claim 1, wherein modulation of the received signals is performed using Pi/4-rotated Quadrature Phase Shift Keying.

11. A method according to claim 1, wherein said numerical signal samples comprise complex number pairs consisting of a real and imaginary part.

12. A method according to claim 1, wherein said numerical signal samples comprise complex number pairs in polar format having a first number representative of the instantaneous signal amplitude and a second number representative of the signals instantaneous phase.

13. A method according to claim 12, wherein said first number is approximately proportional to the logarithm of the signal amplitude.

14. A method according to claim 1, wherein said comparison involves calculating the difference of the compared values and squaring it to obtain said mismatch value.

15. A method according to claim 1, wherein said comparison involves calculating the difference of the real parts of the compared values and the difference of the imaginary parts of the compared values and adding the squares of said differences to obtain said mismatch value.

16. A method according to claim 1, wherein said comparison compares complex numbers expressed in polar or logpolar form.

17. A method according to claim 1, wherein said comparison compares complex numbers expressed in polar or logpolar form by computing the squared, scaled radius of one number minus twice the product of the radii of the compared numbers times the cosine of the corrected phase difference between the compared numbers.

18. A method according to claim 1, wherein said accumulation of mismatch over self-consistent symbol sequences is performed using the Viterbi algorithm.

19. A method according to claim 1, wherein said scaling factors are adapted after processing each one or more signal samples by modifying them in the direction that would result in a closer comparison and thus lower mismatch between the compared values.

20. A method for demodulating or decoding received digital modulated signal, comprising the steps of:

obtaining numerical signal samples from said received signals;

collecting a number of said numerical signal samples in a digital memory to obtain a sample block for processing;

determining which sample has a largest amplitude in said sample block and scaling all sample amplitudes to said largest amplitude;

comparing scaled signal samples with sample values expected for each of a number of possible symbol sequences using separate scaling factors associated with each of said symbol sequences in order to determine a mismatch value for each sequence; and determining from among consecutive symbol sequences that are logically self consistent that which has the lowest cumulative mismatch while adapting said scaling factors to account for changes in received signal amplitude over said sample block.

\* \* \* \* \*